United States Patent
Hasenberg et al.

(10) Patent No.: US 7,903,711 B1
(45) Date of Patent: Mar. 8, 2011

(54) SEPARATE CONFINEMENT HETEROSTRUCTURE WITH ASYMMETRIC STRUCTURE AND COMPOSITION

(75) Inventors: Thomas C. Hasenberg, Campbell, CA (US); Guoli Liu, Pleasanton, CA (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 12/617,780

(22) Filed: Nov. 13, 2009

(51) Int. Cl.
*H01S 5/00* (2006.01)

(52) U.S. Cl. .................................... 372/45.01; 372/43.01

(58) Field of Classification Search ............ 372/43.01, 372/45.01
See application file for complete search history.

(56) References Cited

U.S. PATENT DOCUMENTS

| | | | |
|---|---|---|---|
| 4,984,242 A | 1/1991 | Scifres et al. | |
| 5,438,585 A | 8/1995 | Armour et al. | |
| 5,889,805 A | 3/1999 | Botez et al. | |
| 6,028,874 A * | 2/2000 | Wada et al. | 372/45.011 |
| 6,084,898 A | 7/2000 | Heffernan et al. | |
| 7,123,641 B2 * | 10/2006 | Hirukawa et al. | 372/45.01 |
| 7,129,572 B2 | 10/2006 | Wang | |
| 7,198,972 B2 | 4/2007 | Sato | |
| 7,756,179 B2 * | 7/2010 | Shigihara | 372/45.01 |
| 2002/0122447 A1 * | 9/2002 | Fukunaga et al. | 372/43 |
| 2004/0066818 A1 * | 4/2004 | Yamamoto et al. | 372/45 |
| 2005/0185687 A1 * | 8/2005 | Ohgoh | 372/43.01 |
| 2007/0243644 A1 * | 10/2007 | Hirukawa et al. | 438/22 |

\* cited by examiner

*Primary Examiner* — Minsun Harvey
*Assistant Examiner* — Phillip Nguyen
(74) *Attorney, Agent, or Firm* — Morrison & Foerster LLP

(57) ABSTRACT

A separate confinement heterostructure includes a quantum-well layer bounded by an n-side waveguide layer and a p-side waveguide layer. The waveguide layers guide a lasing mode of the heterostructure. The n-side waveguide layer is composed of indium gallium phosphide (InGaP) and the p-side layer is composed of aluminum gallium arsenide (AlGaAs). The heterostructure is configured such that more than 80% of the optical mode propagates in the n-side waveguide layer.

17 Claims, 2 Drawing Sheets

SEPARATE CONFINEMENT HETEROSTRUCTURE WITH ASYMMETRIC STRUCTURE AND COMPOSITION

TECHNICAL FIELD OF THE INVENTION

The present invention relates in general to diode-lasers. The invention relates in particular to separate confinement heterostructures including an active region wherein laser radiation is generated, the active region being bounded by a waveguide regions in which the generated radiation is optically confined, and the waveguide regions being bounded by cladding regions for electrically confining electrons and holes, recombination of which in the active radiation generates the laser radiation.

DISCUSSION OF BACKGROUND ART

Since about 1990 all commercially available diode lasers (edge-emitting semiconductor lasers) have been epitaxially grown as separate confinement (SC) heterostructures. A SC heterostructure, in a simplest form, includes an active layer often referred to as a quantum-well (QW) layer bounded on each side by a waveguide layer (optical confinement layer). Bounding each waveguide layer is a doped cladding layer (electrical confinement layer). The cladding layers are doped to increase electrical conductivity of the layers. One of the layers is p-doped and the other n-doped. This heterostructure is, electrically, a p-i-n diode. The heterostructure is typically grown on an n-type semiconductor wafer beginning, after any intermediate layers, with the n-doped cladding layer. The completed structure is usually mounted "p-side down" on a heat-sink.

SC heterostructures are typically symmetrical structures. That is, the waveguide-layers have the same thickness and are of the same semiconductor material composition, and the cladding layers have the same thickness, and with an exception that dopants are different, also have the same semiconductor material composition (different from that of the waveguide layers).

The p-doped and n-doped cladding layers are connected, sometimes via one or more other conductive layers, to respectively positive and negative terminals of a source of electrical current. Forward electrical bias applied from the source causes injection of holes from the p-side of the junction and electrons from the n-side of the junction into the depletion region in which lie the (un-doped) waveguide and quantum well layers (the active region of the heterostructure). The injected holes and electrons re-combine in the QW-layer, generating radiation having a wavelength characteristic of the material of the QW-layer. The waveguide layers have a higher band-gap (lower refractive index) than that of the QW-layer and the cladding layers have a higher band-gap (lower refractive index) than that of the cladding layers.

The heterostructure is terminated at one end thereof by a multilayer reflector that is highly reflective at the wavelength generated by the QW-layer. At the other end of the heterostructure is a multilayer having a relatively low reflectivity, or no multilayer at all, which also provides a relatively low reflectivity. This causes the QW-layer and the bounding waveguide-layers to function as a relatively low Q, waveguide laser-resonator. Output radiation is delivered from the low-reflectivity-end of the resonator.

SC heterostructure lasers are characterized in particular by a threshold-current density, which is the minimum areal current density which must be passed through the heterostructure to cause onset of lasing action. The threshold-current density increases with operating temperature of the laser. As threshold-current increases, overall efficiency decreases. Maintaining a low temperature increases the cost and complexity of cooling arrangements. Further changing the temperature of a heterostructure can be useful for changing (tuning) the output radiation wavelength of the heterostructure. For these reasons alone there is a need to reduce the temperature dependence of the threshold current.

SUMMARY OF THE INVENTION

In one aspect of the present invention, a separate confinement heterostructure, comprises an n-doped cladding layer and a first waveguide-layer surmounting the n-doped cladding layer. The first waveguide layer is a layer of indium gallium phosphide having a first thickness and a first conduction-band energy. An active region surmounts the first waveguide-layer. The active region includes at least one quantum well layer. A second waveguide-layer surmounts the active region. The second waveguide layer is a layer of aluminum gallium arsenide having a second thickness and a second conduction-band energy. The second conduction-band energy is greater than the first conduction-band energy and the second thickness is less than the first thickness. A p-doped cladding layer surmounts the second waveguide-layer.

In a preferred embodiment of the invention the first thickness is more than three times greater than the second thickness, and the first waveguide layer has a refractive index greater about 0.1 greater than that of the second waveguide layer. This causes a lasing mode of the heterostructure to propagate with about 80% of the energy therein being in the first waveguide layer, which has lower free-carrier absorption loss than that of the second waveguide layer

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
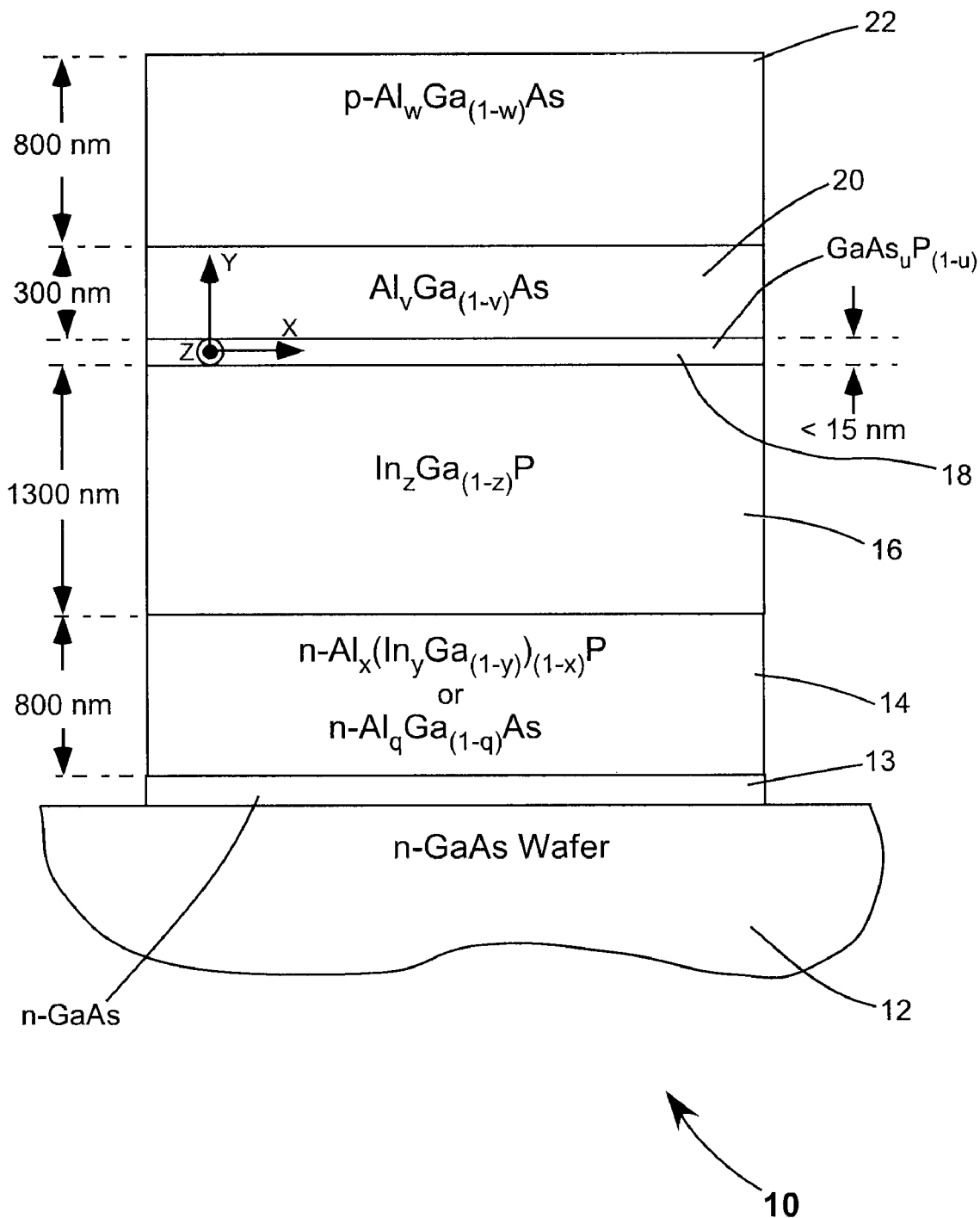
FIG. 1 schematically illustrates a preferred embodiment of a separate confinement heterostructure in accordance with the present invention including first cladding layer of p-doped AlInGaP, a first waveguide layer of InGaP, a quantum-well layer of GaAsP, a second waveguide layer of AlGaAs and a second cladding layer of p-doped AlGas.

Referring now to the drawings, wherein like components are designated by like reference numerals, FIG. 1 schematically illustrates a preferred embodiment 10 of a separate confinement heterostructure in accordance with the present invention. The heterostructure is epitaxially grown on an n-doped gallium arsenide wafer (substrate) 12. In the description of the heterostructure below it is assumed that the emission-wavelength of the heterostructure will be about 808 nanometers (nm). This, of course, is just one example, and the emission wavelength and other details of the example should not be considered as limiting the present invention. The fast-axis and slow-axis of the heterostructure are arbitrarily designated as the Y-axis and the Y-axis. The propagation axis (emission direction) is designated as the Z-axis, perpendicular to the plane of the drawing.

The heterostructure includes a first cladding layer 14 preferably of n-doped aluminum indium gallium phosphide (abbreviation—AlInGaP) having a composition $(Al_yGa_{(1-y)})_{(1-x)} In_xP$, where x is preferably about 0.48 and y is preferably about 0.30. An alternative material for layer 14 is aluminum gallium arsenide (abbreviation AlGaAs) having a composition $Al_qGa_{(1-q)}As$ where q is preferably about 0.50. Layer 14 preferably has a thickness of about 800 nm, for either material.

Surmounting layer 14 is first waveguide-layer 16 of indium gallium phosphide (abbreviation—InGaP) having a composition $In_zGa_{(1-z)}P$ where z is preferably about 0.48. Layer 16 preferably has a thickness of about 1300 nm. This particular InGaP composition has a conduction-band energy of about 0.88 electron volts (eV), and a refractive index of 3.35.

Surmounting waveguide-layer 16 is a quantum-well or active layer 18, preferably of gallium arsenide phosphide (abbreviation GaAsP) having a composition $GaAs_uP_{(1-u)}$, where u is preferably about 0.83. Layer 18 preferably has a thickness between about 3.0 and 15.0 nm. Surmounting QW-layer 18, is a second waveguide layer 20 of aluminum gallium arsenide (abbreviation—AlGaAs) having a composition having a composition $Al_vGa_{(1-v)}As$ where v is preferably about 0.35. Layer 20 preferably has a thickness of about 300 nm. This particular AlGaAs composition has a conduction-band energy of about 0.99 eV, and a refractive index of about 3.34.

Preferably, the thickness of n-side waveguide layer 16 is at least about 1.5-times and most preferably at least about three-times the thickness of p-side waveguide layer 20. The refractive index of p-side waveguide layer 20 is preferably at least about 0.1 less than the refractive index of n-side waveguide-layer 16. Layer 20 is surmounted by a second, cladding layer 22 preferably of p-doped AlGaAs having a composition of $Al_wGa_{(1-w)}As$, where w is preferably about 0.50. Layer 22 preferably has a thickness of about 800 nm.

Those skilled in that art will recognize that while the inventive heterostructure is described as having only one quantum-well layer, that one quantum well layer could be replaced by a group of two or more quantum-well layers separated by barrier layers having a higher conduction-band energy than that of the quantum-well layers. Collectively single and multiple quantum-well layers can be referred to as an active region. The total thickness of the multiple quantum-well layer group (active region), however, is preferably less than about 25.0 nm to minimize threshold current.

Alternative materials for quantum well layer 18 are indium gallium arsenide (abbreviation—InGaAs), indium gallium arsenide phosphide (abbreviation—InGaAsP), indium gallium aluminum arsenide (Abbreviation—InGaAlAs), GaAs, and AlGaAs. Those skilled in the art will recognize that depending on the selection of the composition of quantum-well layer 18, the composition of the waveguide and cladding layers may need to be adjusted within general parameters of the inventive heterostructure described herein.

In FIG. 1, primarily principal layers which provide generation of laser radiation, optical confinement of the radiation, and electrical confinement of carriers (radiative recombination of which in the QW-layer generates the laser radiation) are depicted. Those skilled in the art will recognize that is usual to add a p-doped cap layer (not shown in FIG. 1) to the p-doped cladding layer to facilitate electrical connection to the heterostructure. The cap-layer is more heavily doped than the cladding layer. It is also preferable to grow a so-called buffer-layer 13 of n-doped GaAs on wafer 12 before n-doped cladding layer 14 is grown to promote epitaxial growth of the remaining layers of the heterostructure. By way of example, such a layer preferably has a thickness of about 200 nm. For purposes of this description and the appended claims, buffer layer 13 can be considered as part of wafer 12.

Figure 2A:
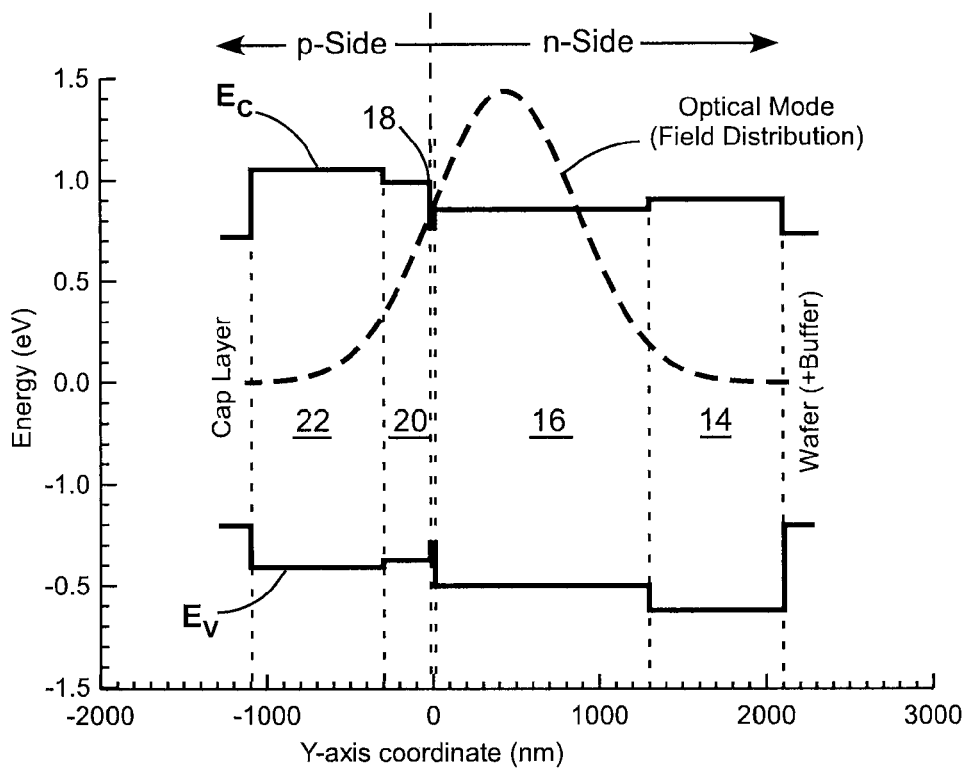
FIG. 2A is a graph schematically illustrating conduction-band energy, valence band energy, and electric field distribution of the optical mode as a function of thickness in the heterostructure of FIG. 1.
Figure 2B:
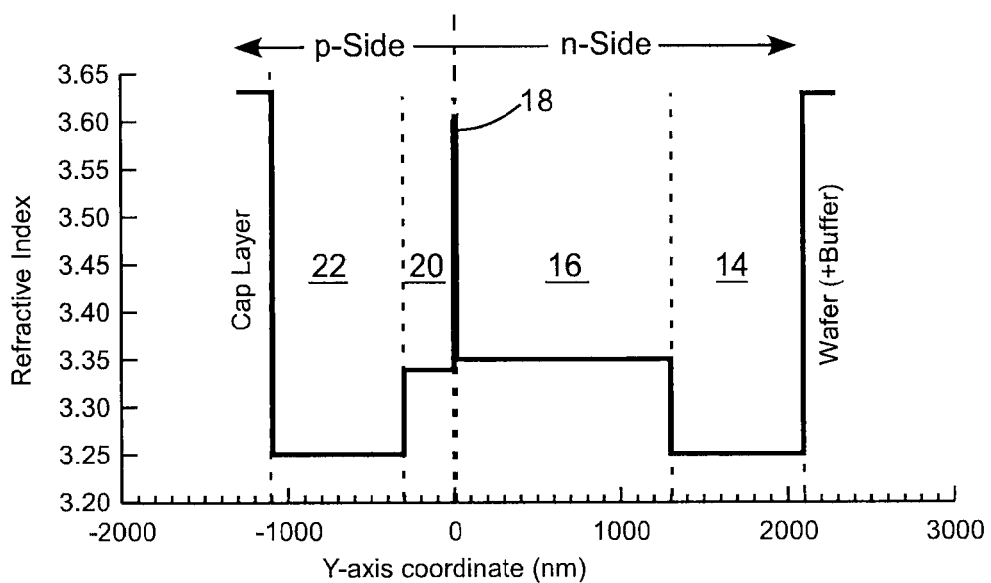
FIG. 2B is a graph schematically illustrating conduction-band energy, valence band energy, and electric field distribution of the optical mode in of the heterostructure of FIG. 1.

FIG. 2A is a graph schematically illustrating calculated conduction-band energy ($E_c$) and valence band energy ($E_v$) as a function of fast-axis coordinate Y for the heterostructure of FIG. 1 with the exemplary preferred material compositions and layer thicknesses discussed above, with layer 14 being a layer of AlGaInP, as exemplified. The electric-field distribution of the optical mode (lasing mode) of the heterostructure is depicted by a bold, dashed curve. The band-gap (Ec-Ev) of the layers is inversely related to the refractive index of the layers. The calculated refractive index as a function of the Y-axis coordinate is depicted in FIG. 2B. The zero of the Y-axis (thickness) coordinate in each of FIGS. 2A and 2B is located at the center of QW layer 18, to highlight the inventive asymmetrical form of the structure in thickness, conduction-band energy and refractive index, in addition to the material-asymmetry indicated by FIG. 1. Prior-art structures are typically symmetrical about the quantum-well layer, both in thickness and composition and properties of layers.

A major contributor to temperature-dependence of threshold-current is non-radiative recombination of electrons and holes outside of the QW layer. For this reason, the p-side waveguide-layer 20 is formulated to have higher conduction-band energy than that of the n-side layer 18. Because of this, electrons are better confined in the QW layer and non-radiative recombination is correspondingly reduced. In this regard, it can be seen from FIG. 2A that the conduction-band energy of the p-side cladding layer is also greater than that of the n-side cladding layer Preferably also, the material on the p-side of the QW also has lower refractive index than that on the n-side. This pushes the optical mode (depicted as a bold dashed curve in FIG. 2A) to the n-side of the QW layer, where the optical loss is lower than on the p-side. This is because free-carrier absorption loss for electrons is about one order lower than that for holes. It can be seen that the lesser thickness and refractive index of the p-side waveguide layer compared with those of the n-side waveguide layer causes about 80% or more of the lasing mode energy to propagate in the lower loss n-side waveguide layer. This also has an advantage that absorption at the emitting facet (not shown) of the heterostructure is decreased and the threshold for catastrophic optical damage (COD) of the facet is increased. Cladding layers 14 and 22, of course, must have conduction-band energy greater than that of the corresponding waveguide layers 16 and 20 to confine both electrons and holes.

Regarding the selection of materials for the inventive heterostructure, AlGaAs is selected for the p-side cladding layer (and the cap layer) because it has a relatively high thermal conductivity compared with that of other III-V semiconductor compounds. AlGaAs is selected for the p-side waveguide-layer\because it can be composed to provide a relatively high ΔEc for optimum electrical confinement. The relatively high thermal conductivity of AGaAs is particularly important, as the heterostructure is mounted p-side down on a heat sink. This outweighs potential reliability (lifetime) problems sometimes associated with aluminum-containing III-V semiconductor compounds.

This potential reliability of aluminum-containing compounds is usually more of a problem in the optical confinement region than in cladding layers, which see very little of the optical mode, as evidenced in the graph of FIG. 2A. The shifting of the optical mode primarily into the n-side waveguide greatly reduces any potential problems with the Al-containing p-side waveguide layer. Because of the mode-shifting into the n-side waveguide layer, and the significantly greater thickness of the n-side waveguide layer compared with that that of the p-side layer, more than 80% percent of the optical mode propagates in the aluminum-free n-side waveguide-layer.

InGaP is selected for the n-side waveguide as it is aluminum-free, has low optical loss, and is very reliable. AlGaInP was selected as n-cladding since its growth conditions are similar to those of InGaP. These materials can be selected because thermal conductivity of the n-side cladding and waveguide layers is much less important than for the p-side cladding and waveguide layers.

What is claimed is:

1. A separate confinement heterostructure, comprising:
    an n-doped cladding layer,
    a first waveguide-layer surmounting the n-doped cladding layer, the first waveguide layer being a layer of indium gallium phosphide having a first thickness and a first conduction-band energy;
    an active region surmounting the first waveguide-layer, the active region including at least one quantum well layer;
    a second waveguide-layer surmounting the active region, the second waveguide layer being a layer of aluminum gallium arsenide having a second thickness and a second conduction-band energy, the second conduction-band energy being greater than the first conduction-band energy and the second thickness being less than the first thickness; and
    a p-doped cladding layer surmounting the second waveguide-layer.

2. The heterostructure of claim 1, wherein the first conduction-band energy is about 0.88 electron Volts and second conduction-band energy is about 0.99 electron Volts.

3. The heterostructure of claim 1, wherein the first-waveguide layer has a first refractive index and the second waveguide-layer a second refractive index, the second refractive index being less than the first refractive index.

4. The heterostructure of claim 2, wherein the first refractive index is about 3.35 and the second refractive index is about 3.34.

5. The heterostructure of claim 1, wherein the first cladding layer is a layer of n-doped aluminum indium gallium phosphide.

6. The heterostructure of claim 1, wherein the first cladding layer is a layer of n-doped aluminum gallium arsenide.

7. The heterostructure of claim 1, wherein the first waveguide-layer thickness is at least about three times the second waveguide-layer thickness.

8. The heterostructure of claim 1, where in the active region includes only one quantum well layer.

9. A separate confinement heterostructure, comprising:
    a first cladding layer, the first cladding layer being one of a layer of n-doped aluminum indium gallium phosphide and a layer of n-doped aluminum gallium arsenide;
    a first waveguide-layer surmounting the n-doped cladding layer, the first waveguide layer being a layer of indium gallium phosphide having a first thickness;
    an active region surmounting the first waveguide-layer, the active region including at least one quantum-well layer having a lower conduction-band energy than that of the first waveguide-layer, the quantum well layer being a layer of one of indium gallium phosphide, gallium arsenide phosphide, gallium arsenide or aluminum gallium arsenide;
    a second waveguide-layer surmounting the active region, the second waveguide layer being a layer of aluminum gallium arsenide having a second thickness and having a conduction-band energy greater than that of the quantum-well layer, the second thickness being less than the first thickness; and
    a second cladding layer surmounting the second waveguide-layer, the second cladding layer being a layer of aluminum gallium arsenide having a conduction-band energy greater than that of the second waveguide-layer.

10. The heterostructure of claim 9, wherein the thickness of the first waveguide layer is at least about 1.5 times the thickness of the second waveguide layer.

11. The heterostructure of claim 10, wherein the thickness of the first waveguide-layer is at least about three times the thickness of the second waveguide layer.

12. The heterostructure of claim 9, wherein the first and second waveguide layers are of homogeneous composition with the first waveguide-layer having a conduction-band energy less than that of the second waveguide layer and the first waveguide-layer having a refractive index greater than that of the second waveguide-layer.

13. The heterostructure of claim 12, wherein the first cladding layer is a layer of aluminum gallium indium phosphide having a composition $(Al_yGa_{(1-y)})_{(1-x)}In_xP$, where y is about 0.30 and x is about 0.48, and a thickness of about 800 nm; the first waveguide layer has a composition $In_zGa_{(1-z)}P$, where z is about 0.48, and a thickness of about 1300 nm; the quantum-well layer is a layer of gallium arsenide phosphide having a composition $GaAs_uP_{(1-u)}$, where u is about 0.83, and thickness between about 3.0 and 15.0 nm; the second waveguide layer has a composition $Al_vGa_{(1-v)}As$ where v is about 0.35, and a thickness of about 300 nm; and the second cladding layer has a composition $Al_wGa_{(1-w)}As$, where w is about 0.50, and a thickness of about 800 nm.

14. A separate confinement heterostructure, comprising:
    a first cladding layer, the first cladding layer being one of a layer of n-doped aluminum indium gallium phosphide and a layer of n-doped aluminum gallium arsenide the first cladding layer having a first conduction-band energy;
    a first waveguide-layer surmounting the n-doped cladding layer, the first waveguide layer being a layer of indium gallium phosphide having a first thickness, a first refractive index, and a second conduction-band energy;
    an active region surmounting the first waveguide-layer, the active region including at least one quantum-well layer having a third conduction-band energy lower than the second conduction-band energy, the quantum well layer being a layer of one of indium gallium phosphide, gallium arsenide phosphide, gallium arsenide or aluminum gallium arsenide;
    a second waveguide-layer surmounting the active region, the second waveguide layer being a layer of aluminum gallium arsenide having a second thickness, a second refractive index, and a fourth conduction-band energy, the fourth conduction-band energy being greater than the second and third conduction-band energy, the second refractive index being less than the first refractive index, and the second thickness being less than the first thickness; and a second cladding layer surmounting the second waveguide layer, the second cladding layer being a layer of aluminum gallium arsenide having a fifth conduction-band energy greater than the first conduction-band energy.

15. The heterostructure of claim 5, wherein the thickness of the first waveguide layer is at least about 1.5 times the thickness of the second waveguide layer.

16. The heterostructure of claim 15, wherein the thickness of the first waveguide-layer is at least about three times the thickness of the second waveguide layer.

17. The heterostructure of claim 16, wherein the first cladding layer is a layer of aluminum gallium indium phosphide having a composition $(Al_yGa_{(1-y)})_{(1-x)}In_xP$, where y is about 0.30 and x is about 0.48, and a thickness of about 800 nm; the first waveguide layer has a composition $In_zGa_{(1-z)}P$, where z is about 0.48, and a thickness of about 1300 nm; the quantum-well layer is a layer of gallium arsenide phosphide having a composition $GaAs_uP_{(1-u)}$, where u is about 0.83, and thickness between about 3.0 and 15.0 nm; the second waveguide layer has a composition $Al_vGa_{(1-v)}As$ where v is about 0.35, and a thickness of about 300 nm; and the second cladding layer has a composition $Al_wGa_{(1-w)}As$, where w is about 0.50, and a thickness of about 800 nm.

\* \* \* \* \*